United States Patent [19]

Edme

[11] Patent Number: 5,177,707
[45] Date of Patent: Jan. 5, 1993

[54] MEMORY WITH IMPROVED READING TIME

[75] Inventor: Franck Edme, Aix en Provence, France

[73] Assignee: SGS-Thomson Microelectronics S.A., Gentilly, France

[21] Appl. No.: 591,281

[22] Filed: Oct. 1, 1990

[30] Foreign Application Priority Data

Oct. 2, 1989 [FR] France .................. 89 12845

[51] Int. Cl.[5] .......................................... G11C 16/04
[52] U.S. Cl. ........................ 365/203; 365/185; 365/208
[58] Field of Search ............ 365/104, 185, 203, 208, 365/189.01, 204, 189.09

[56] References Cited

U.S. PATENT DOCUMENTS

| 4,713,797 | 12/1987 | Morton et al. | 365/208 |
| 4,879,682 | 11/1989 | Engles | 365/203 X |
| 4,908,795 | 3/1990 | Tsuchiya et al. | 365/189.01 |

FOREIGN PATENT DOCUMENTS 49462  4/1982  European Pat. Off. .
2070372  9/1981  United Kingdom .

OTHER PUBLICATIONS

Patent Abstracts of Japan, vol. 5, No. 185 (P-091) Nov. 25, 1981 and JP-A-56 114 193.

Primary Examiner—Joseph A. Popek
Attorney, Agent, or Firm—Pollock, VandeSande & Priddy

[57] ABSTRACT

To shorten the reading cycle of a memory, the memory cells of which comprise floating gate transistors, a circuit for pre-charging the bit lines of the memory is used, this circuit being independent of the reading sense amplifier proper. This pre-charging circuit includes a differential amplifier receiving, firstly, a voltage signal for the effective pre-charging of the bit line and, secondly, a pre-charging voltage reference signal. So long as the effective pre-charging has not reached the assigned value, the differential amplifier delivers a command signal to a power transistor that pre-charges the bit lines. As soon as the assigned pre-charging value is reached, the power transistor goes off, and the circuit of the amplifier is itself uncoupled.

6 Claims, 2 Drawing Sheets

MEMORY WITH IMPROVED READING TIME

BACKGROUND OF THE INVENTION

1. Field of the Invention

An object of the present invention is a memory in integrated circuit form with an accelerated reading cycle. This acceleration is due to a more powerful and faster pre-charging of the bit lines. The invention can be applied more particularly in the field of EPROM memories or in that of EEPROM memories, where the memory cell has a floating gate transistor as its memorizing element.

The memory cells of a memory are organized in matrix form at the intersections of rows and columns: the rows are said to be bit lines and the columns are word lines. To gain access to the information contained in a memory cell, decoders are used to select a bit line and a word line that are characteristic of the memory cell to be read. The selection of a memory cell is aimed at connecting it to a current sensing circuit known as a sense amplifier. Depending on its state of programming, the memory cell formed by the floating gate transistor then behaves as an open circuit or as a resistor. If it is a resistor, the bit line to which it belongs is connected, at the moment of its selection, to the ground of the circuit of the memory. Under these conditions, a discharge current may flow in the bit line. On the contrary, if it is an open circuit, the voltage applied to the bit line is preserved, and the sense amplifier does not detect the passage of short-circuit current. Consequently, a static electrical state, namely the electrical state programmed in the memory, has been thus converted into a dynamic electrical state variable in time. This change in state is then used in the different circuits connected to the memory.

2. Description of the Prior Art

The process, as just described, requires the pre-charging of the bit line at a certain voltage, before the selection of the memory cell concerned by the bit line. The sense amplifier is connected to the bit line at least at the end of this pre-charging operation. As soon as the concerned word line is activated, the short-circuit phenomenon or the open circuit phenomenon occurs, and the current flows or does not flow in the sense amplifier. Since the sense amplifier is thus connected beforehand to the bit line, methods have been developed and perfected for pre-charging the bit line. In these methods, the bit line pre-charging circuit is integrated with the sense amplifier. A sense amplifier D of this type can be recognized in FIG. 1. This figure concerns the invention, but also shows the state of the art with the sense amplifier D. With a circuit such as this, it becomes possible to pre-charge the bit lines which can be likened, at the time of pre-charging or reading, to an RC circuit, at the end of a period substantially equal to 50 ns.

This standard pre-charging circuit works as follows: at the outset, the bit line represented by any one of the RC circuits to the left of figure is connected to the point C. The potential of the bit line is at $V_{SS}$, equal to zero volts. To pre-charge the bit line, the sense amplifier D is activated, for example by means of a signal VREF that is applied to the gate of a p type transistor $P_1$. The transistor $P_1$ is connected firstly to $V_{cc}$ (supply voltage) and, secondly, to a point A. The activation by the signal VREF is aimed at taking A to the value of $V_{cc}$. When this is done, an n type transistor $N_1$, which is connected by its drain to the potential Vcc and receives the potential of the point A at its gate, becomes conductive. This is also true for a transistor $NAT_2$ which receives the potential of the point A at its gate, and has its drain also connected to Vcc by the turning on of a p type transistor $P_2$. The transistor $P_2$ too is controlled by the control potential VREF. The transistors $N_1$ and $NAT_2$ then charge the bit line to which they are connected at the point C by their source. The voltage of the point C rises. Since the voltage of the point C rises, an n type transistor $N_2$ is prompted to become conductive. The transistor $N_2$ is cascade-mounted, between the transistor $P_1$ and an n type transistor $NAT_1$, between Vcc and the ground. The transistor $N_2$ receives the voltage of the point C at its gate. The transistor $NAT_1$ is mounted as a diode because of the connection of its gate to its drain.

A reverse feedback then acts on the voltage of the point A. The voltage of the point A therefore stabilizes at an intermediate voltage determined by the transistors $P_1$, $N_2$ and $NAT_1$. Owing to the fact that its gate is short-circuited to its drain, the transistor $NAT_1$ behaves like a diode: it is used to increase the voltage of the point A as soon as a current flows in the transistor $N_2$ and in the transistor $NAT_1$. The voltage at the point C is then equal to the conduction threshold voltage $V_T$ of the transistor $N_2$ ($V_{TN2}$) added to the conduction threshold voltage of the transistor $NAT_1$ ($V_{TNAT1}$), that is, 1.2 volts.

Indeed, if the voltage at C rises, the transistors $P_2$ and $NAT_1$ tend to be more conductive and make the voltage fall at the point A. The voltage C then decreases naturally, by the fact that the transistors $N_1$ and $NAT_2$ then become less conductive. By contrast, if the voltage at C drops, these two transistors tend to be less conductive and the reverse phenomenon occurs. Thus, the transistors $N_1$ and $NAT_2$ charge the bit line until the voltage at C has reached this value.

At the time of reading, the bit line to be read may or may not be considered to be a resistor of the point C grounded, depending on the state of programming of the memory cell to be read in this bit line. When there is a link to the ground, the voltage at the point C drops sharply and the transistor $NAT_2$ has to let through a lot of current. As the control of the transistor $NAT_2$ has not varied, since the voltage of the point A remains at the same potential during the reading operation, the result thereof is that the voltage of an intermediate point B between the transistor $P_2$ and the transistor $NAT_2$ rises again sharply. By contrast if, at the time of the reading, no "short circuit" is detected, the voltage at the point B remains at its initial low level. An output inverter assembly $P_4$-$N_4$ connected to this point B flips over or does not flip over, respectively, as a function of this reading. The output S respectively delivers a high signal ($V_{cc}$) or a low signal ($V_{ss}$).

The slowness of the charging of the bit lines comes essentially from the reverse feedback circuit $NAT_2$-$N_2$-$NAT_1$. Given the technology implemented to date, the rising time of the voltage, at the point C, to the value of 1.2 volts is of the order of 50 ns, depending on the number of cells per bit line. This duration is far too long.

Besides, it can be noted that each bit line or, rather, each group I to J of bit lines should be connected to a specific sense amplifier. In a particular assembly, each bit line is connected to 512 memory cells. In this example, where the reading is in eight bits, eight groups of bit lines are set up and, in each group of bit lines, it is possible to have 64 bit lines (I=1; J=64). In each group of bit lines, we thus have 64 bits of the same weight corresponding to 64 different words. Thus, for each group of bit lines, there is a sense amplifier such as the sense amplifier D. This assembly calls for efficient mastery over the manufacturing process since the bit lines in each group are charged by different charge circuits. If, under these conditions, there is a disparity in the characteristics of the transistors $NAT_2$, $NAT_1$ or $N_2$, it could also lead to reading aberrations.

An object of the invention is to overcome these drawbacks by proposing a bit line pre-charging circuit that is independent of the sense amplifier itself and is far more powerful. Besides, to prevent manufacturing disparities and also to limit the space occupied by the layout entailed in an additional, more powerful pre-charging circuit, provision has been made for short-circuiting all the bit lines to be pre-charged, together, at the time of pre-charging. As a result, there is obtained a pre-charging that is simultaneously fast, identical for all the lines and without any notable additional bulkiness.

SUMMARY OF THE INVENTION

An object of the invention, therefore, is a memory of the type wherein the memory cells comprise a floating gate transistor, including bit lines to gain access to these memory cells, and means for pre-charging these bit lines before the reading of the electrical states stored in these memory cells, wherein said memory has a differential amplifier receiving a pre-charging voltage reference signal to be compared with a voltage for the effective pre-charging of the bit line, said differential amplifier delivering a charging command signal, and a power transistor activated by this command signal to pre-charge the bit line.

DESCRIPTION OF THE DRAWINGS

The invention will be understood more clearly from the following description and from the appended figures. These figures are given purely by way of an indication and in no way restrict the scope of the invention. Of these figures.

DETAILED DESCRIPTION OF THE INVENTION

Figure 1:
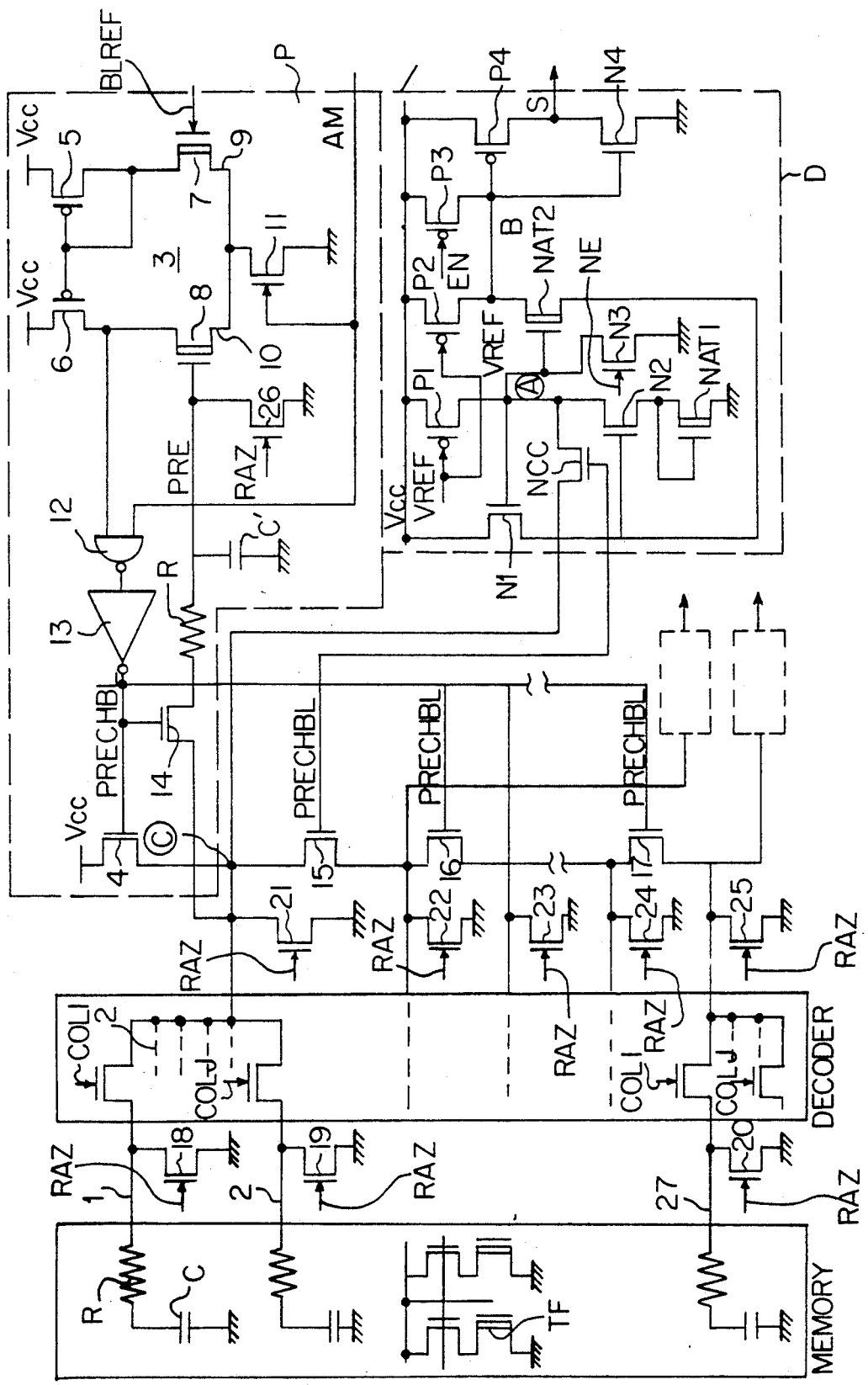
FIG. 1 shows a schematic view, already referred to, of a memory according to the invention.

FIG. 1 shows a memory of the type in which the memory cells comprise a floating gate transistor TF. Such floating gate transistors are essentially simulated herein by RC circuits having the same behavior as the bit lines when they are pre-charged as well as when they are read. Indeed, because of their specific technologies, the EEPROM type memories have networks of connections forming capacitors among them, the resistivity of these connections being such that it cooperates in the formation of an RC circuit such as this. The memory has bit lines such as the lines 1, 2, etc. that enable access to the memory cells. It also includes a circuit P to pre-charge the bit lines before the reading of the electrical states stored in these memory cells.

According to a major characteristic of the invention, the pre-charging circuit P has a differential amplifier 3. This differential amplifier receives, firstly, a voltage reference signal BLREF that must be compared with a signal PRE for the effective pre-charging of the bit line. This differential amplifier delivers a signal PRECHBL that commands the pre-charging of the bit line. This bit line pre-charging command signal is applied as a command to a power transistor 4 that is connected to the point C at the bit line to pre-charge it. By its other terminal, the transistor 4 is connected to the supply Vcc of the circuit.

The structure of the circuit P is as follows. Two enhanced p-type transistors, respectively 5 and 6, are cascade-mounted with two n-type transistors, 7 and 8, connected together by their sources 9 and 10 respectively. The common point of the sources 9 and 10 is, moreover, connected to the ground by an n type transistor 11. The transistors 7 and 8 form the differential stage. At their gate, they receive respectively the signals BLREF and PRE. The two gates of the two transistors 5 and 6 are connected together and are connected, at the same time, to the drain of the transistor 5. The transistors 7 and 6 form a current mirror to impose proportionate currents in the two branches of the amplifier 3.

At the beginning of the pre-charging operation, as shall be seen further below, the voltage available on the bit line, at the point C, is zero. As a consequence, the bit line pre-charging signal PRE is zero. When a pre-charging operation is to be performed, a positive signal AM is sent to the control gate of the transistor 11. When this is done, the sources 9 and 10 of the native transistors 7 and 8 can be considered to be connected to the ground. The differential amplifier is then put into operation. When the sources 9 and 10 are connected to the ground, the transistors 5 and 7 become conductive. As a consequence, the transistor 6 also becomes conductive. However, since the effective pre-charging signal PRE applied to the control gate of the transistor 8 is then zero, the drain/source voltage of the transistor 8 is not zero. As a consequence, the drain of the transistor 6 is taken to the supply potential $V_{cc}$. The potential of the drain of the transistor 6 as well as the command AM for enabling the operation of the differential amplifier are applied to the inputs of a NAND gate 12 which then delivers a zero logic state. This zero logic state is introduced to the input of an inverter 13 that delivers a command signal for the pre-charging of the bit lines PRECHBL that are now at the state 1. This state 1 command makes the bit line charging transistor 4 conductive.

The bit line charging signal is, moreover, picked up at the point C and is conducted, by means of a simulation circuit R'C' to the control gate of the transistor 8 as a signal PRE. The circuit R'C' is a circuit for simulating the charge of a bit line. This circuit R'C' exists in reality: its indication herein is not symbolic. The purpose of this circuit is to have knowledge of the effective pre-charging voltage of the bit line, at the end of the bit line and not at its input. The midpoint of the circuit R'C' therefore delivers a signal PRE for the effective pre-charging of the bit line.

The circuit R'C' could have been replaced by an additional, real bit line, for example one of the type used in repair procedures. However, the choice of a circuit R'C' is preferred because it takes up less space. Besides, as shall also be seen further below, in a preferred way, several bit lines are pre-charged at the same time and it is therefore necessary to create a simulation of the pre-charging of several bit lines at the same time. This cannot be equivalent to the pre-charging of a single bit line.

As soon as the bit line effective pre-charging signal has reached the level dictated by the reference signal BLREF, the drain/source voltage of the transistor 8 starts decreasing, the differential amplifier 3 flips over, and the bit line pre-charging command signal PRECHBL changes state: it goes back to the state zero. When this is done, the transistor 4 goes off. At this moment, the pre-charging is over and the bit line is available for the reading proper. Besides, a transistor 14, placed in series between the point C and the circuit R'C', and also activated by the pre-charging command signal PRECHBL, itself gets turned off too. It then uncouples the differential amplifier from the reading circuit of the memory. In doing so, we avoid falsifying the measurement of the drop in voltage at the point C owing to the presence of the capacitances of the differential amplifier 3 (and that of the circuit R'C') which may delay the flipping over of the inverter $P_4N_4$.

As has been explained above, the presence of the bit line pre-charging command signal is taken advantage of to short-circuit all the bit lines together. This short-circuit is achieved by means of n type transistors such as 15, 16 and 17 interposed in parallel between all the groups of bit lines, at the position of their connection to the corresponding sense amplifiers D. The command signal for the pre-charging of the bit lines PRECHBL is applied to the control gates of these transistors 15 to 17. It makes them conductive at the moment of this pre-charging. As soon as the pre-charging is over, the transistors 14 to 17 are off: the bit lines recover their independence: it is noted that a second advantage of the fact of short-circuiting all the bit lines together at the time of the pre-charging is that it ensures that all the bit lines will be pre-charged at one and the same value, and that this value is thus independent of the disparities in the characteristics of the pre-charging transistors of the sense amplifiers themselves.

The sense amplifier D itself is kept as formerly defined: the advantage of this is that the implementation of the improvement of the invention does not complicate the designing of the reading circuits of the integrated circuits.

In order that the differential amplifier 3 may be very swift, the p-type transistors 5 and 6 are preferably large capacity transistors. The comparison transistors are 7 and 8. Indeed, the zone of efficient operation of an n-type differential amplifier is between $2V_T$ and $V_{cc}$. Now, the threshold voltage $V_T$ of a normal (that is, enhanced) n-type transistor is in the range of 1.5 volts. Consequently, a differential amplifier of this type would work well when the voltages to be compared, PRE and BLREF, are greater than 3 volts and smaller than $V_{cc}$. Now, this is not the case since the pre-charging voltage to be obtained is 1.2 volts. By properly choosing transistors 7 and 8, the conduction threshold voltage $V_T$ of which is in the range of 0.2 volts, it is easy to arrive at a satisfactory range of operation.

The ideal answer would have been to use a p-type differential comparator. However, this approach cannot be chosen, even in a CMOS type technology, for reasons of size entailed by a structure such as this in the integrated circuit. In effect, p-type transistors call for the presence of additional trenches that occupy too much space.

The presence of the differential amplifier enables the pre-charging of the bit lines as if it were desired to achieve a pre-charging value of $V_{cc}$ by means of the transistor 4. The bit line pre-charging time constant is not changed. However, given that the set goal in terms of voltage is higher, the 1.2 volt threshold is reached more speedily than if it had been the aim to obtain precisely this threshold. The differential amplifier enables the pre-charging to be cut off as soon as this voltage has been reached. Furthermore, with the differential amplifier 3, the reverse feedback $NAT_2$, $NAT_1$, $N_2$ no longer becomes preponderant.

The total circuit works as follows: before starting a reading cycle, it is now necessary to discharge all the bit lines before charging the right bit lines. To this end, a prior zero-setting command RAZ is used to short-circuit all the bit lines to the ground, before and after a decoder providing access to the bit lines.

The command RAZ is applied to the gates of n type transistors such as 18 to 25. These transistors are placed in parallel between these bit lines and the ground of the circuit. In acting thus, we are sure to have ground potential $V_{SS}$ available on either side of the decoder. This zero-setting operation lasts about 20 ns. However, this zero-setting causes no loss of time, for it cannot be done during the decoding operation itself.

The zero-setting command is furthermore applied to an n-type transistor 26 parallel-connected between the input of the control gate of the transistor 8 and the ground. During the zero-setting, it is thus seen to it that the effective pre-charging signal PRE is itself also equal to zero.

The prior zero-setting of the bit lines is now necessary because a bit line may remain charged from a previous writing operation, in which case its voltage may remain greater than 1.2 volts. Without a zero-setting operation, the differential amplifier would be neutralized since the signal PRE would be greater than BLREF from the very outset. In this case, owing to the fact that, with the device of the invention, the pre-charging is done more speedily (in 10 ns instead of 50 ns), and since the stabilization at 1.2 volts given by the sense amplifier D is no longer awaited, there is the risk that, without this prior zero-setting operation, incorrect reading operations would be done.

Figure 2:
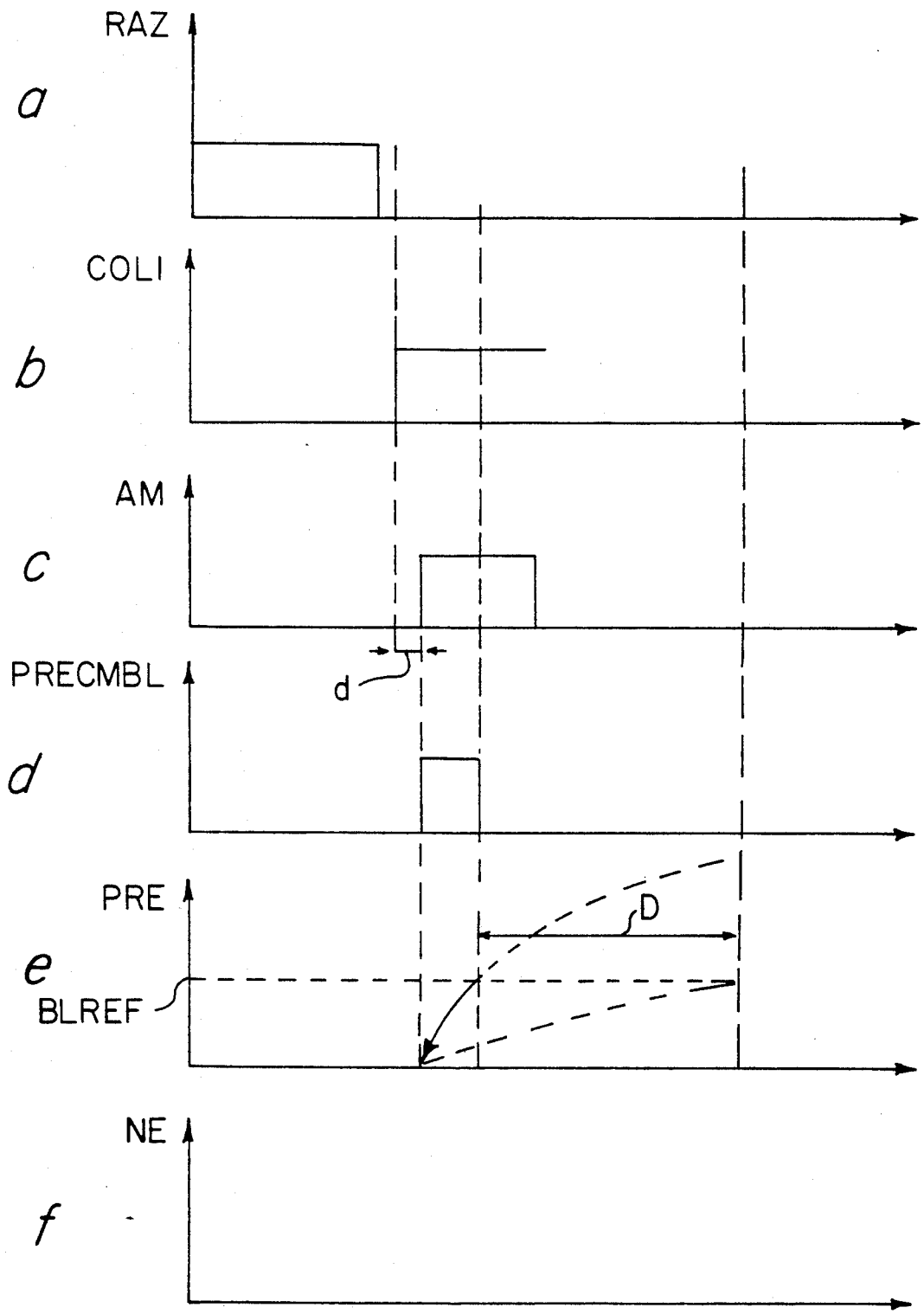
FIGS. 2(a-f) are timing diagrams of signals applied in the invention.

FIG. 2 makes it possible to understand the changes undergone by the signals. Once the zero-setting is acquired, the real bit line that is to be pre-charged is selected. For example, by a command COL I is used to select one among the 64 bit lines connected to each of the eight groups of bit lines. Thus, in the first group, it is desired to pre-charge the bit line 1 and, in the second group, it is desired to pre-charge the bit line 27. With the circuit of the invention, the pre-charging is now faster: it is of the order of 10 ns. Hence, it is necessary to wait for the right bit lines to be selected. This means that the command AM for enabling the differential amplifier 3 should be sent out with a certain delay d with respect to the start of the selection of the bit lines. Previously, taking account of the relatively slowness of the time taken by the pre-charging circuits to rise to 1.2 volts, this delay was not of critical importance: the two commands could be simultaneous. Now, it is necessary for the enabling command AM to appear at the end of a period of about 5 ns after the start of the selection. The activated pre-charging of the bit line is then immediate. The bit line pre-charging command PRECHBL lasts until (FIG. 2) the signal PRE has reached the value BLREF.

Preferably, it is even possible to accelerate the pre-charging of the sense amplifier circuit itself. Indeed, the stabilization of the voltage at the point A at the value $V_{TN} + V_{TNAT}$ is always as slow. To this end, between the source of the transistor $N_1$ of the sense amplifier D and the gate of this transistor, a short-circuit transistor $N_{cc}$ is interposed. The short-circuit transistor is commanded by the bit line pre-charging signal PRECHBL. As soon as this pre-charging is in progress, the potential of the point A is made to go to the bit line pre-charging potential. transistor $N_{cc}$ goes off, and the point A again becomes independent with respect to the pre-charging voltage. FIG. 2e also shows the time gain D obtained during a reading cycle with the method of the invention. With the invention, in a total reading cycle of 200 ns, the reading operations proper, of a standard type, can be started 40 ns earlier than was the case previously.

A signal NE, or its complementary signal EN, is applied to the control gates of transistors $N_3$ and $P_3$ respectively. The transistor $N_3$ is connected between the point A and the ground. The transistor $P_3$ is connected between the point B and the supply. These signals serve to de-activate the sense amplifier D. They are of a known type and enable the user to manage the sense amplifier.

What is claimed is:

1. A memory comprising:
    a plurality of memory cells, each of which includes a floating gate transistor;
    bit lines to gain access to said memory cells;
    means for pre-charging said bit lines before a reading of memory cell electrical states;
    a differential amplifier receiving a pre-charging voltage reference signal to be compared with a voltage corresponding to an effective pre-charging of said bit lines, said differential amplifier delivering a charging command signal;
    said means for pre-charging said bit-lines comprising a power transistor activated by said command signal for pre-charging said bit lines;
    said power transistor having a drain, a source, and a gate, and being serially connected by its drain and source between a power supply and said bit lines, and receiving on its gate said command signal.

2. A memory according to claim 1, including a simulating circuit comprising a resistance connected by one first end to a first end of a capacitor, said resistance being connected by said first end to an input of said differential amplifier and by another end to said power supply, said capacitor being connected by a second end to ground, said simulating circuit simulating an effective pre-charging voltage.

3. A memory according to claim 1 or claim 2 comprising a circuit to connect the bit lines to one another at the time of pre-charging.

4. A memory according to claim 1 or claim 2 wherein the differential amplifier includes, for comparison, two transistors so as to introduce no error into the comparison of the reference voltage with the effective pre-charging voltage.

5. A memory according to claim 1 or claim 2 including a circuit to uncouple the differential amplifier at the time of reading electrical states, to prevent maintenance of a voltage on the bit lines due to the presence of stray capacitance from said differential amplifier.

6. A memory according to claim 1 or claim 2 including a circuit for reading the electrical states, said reading circuit including a transistor divider bridge and a switching transistor to connect a midpoint of the bridge in circuit with the bit lines during pre-charging.

* * * * *

UNITED STATES PATENT AND TRADEMARK OFFICE
CERTIFICATE OF CORRECTION

PATENT NO. : 5,177,707

DATED : January 5, 1993

INVENTOR(S) : Franck Edme

It is certified that error appears in the above-identified patent and that said Letters Patent is hereby corrected as shown below:

Column 1, line 60, after "figure" insert --1--.

Column 5, line 54, delete "properly".

Column 7, line 8, after "potential." insert --As soon as the pre-charging is over, the short circuit--.

Signed and Sealed this

Sixteenth Day of November, 1993

Attest:

BRUCE LEHMAN

*Attesting Officer*   Commissioner of Patents and Trademarks